United States Patent [19]

Seidler

[11] Patent Number: 4,883,435

[45] Date of Patent: Nov. 28, 1989

[54] SOLDER-BEARING TERMINAL PIN AND LEAD

[75] Inventor: Jack Seidler, Flushing, N.Y.

[73] Assignee: North American Specialties Corporation, Flushing, N.Y.

[21] Appl. No.: 129,715

[22] Filed: Dec. 7, 1987

Related U.S. Application Data

[63] Continuation of Ser. No. 876,820, Jun. 20, 1986, abandoned, which is a continuation-in-part of Ser. No. 600,362, Apr. 16, 1984, abandoned, which is a continuation of Ser. No. 396,764, Jul. 9, 1982, abandoned, and a continuation-in-part of Ser. No. 850,754, Apr. 11, 1986, Pat. No. 4,728,305, which is a continuation-in-part of Ser. No. 793,654, Oct. 31, 1985, Pat. No. 4,679,889, which is a continuation-in-part of Ser. No. 737,830, May 24, 1985, Pat. No. 4,605,278.

[51] Int. Cl.⁴ .............................................. H01R 4/02
[52] U.S. Cl. .................................... 439/876; 439/83; 29/843
[58] Field of Search ...................... 439/83, 874–876, 439/736; 29/843

[56] References Cited

U.S. PATENT DOCUMENTS

| | | | |
|---|---|---|---|
| 3,864,014 | 2/1975 | Lynch | 439/389 |
| 3,915,546 | 10/1975 | Cobaugh et al. | 439/876 |
| 4,085,998 | 4/1978 | Owens | 439/876 |
| 4,193,654 | 3/1980 | Hughes et al. | 439/676 |
| 4,203,648 | 5/1980 | Seidler | 439/876 |
| 4,286,837 | 9/1981 | Yasutake et al. | 439/637 |
| 4,302,067 | 11/1981 | Monson et al. | 439/876 |
| 4,357,069 | 11/1982 | Milora | 439/876 |
| 4,367,910 | 1/1983 | Seidler | 439/876 |
| 4,433,892 | 2/1984 | Seidler | 439/876 |
| 4,679,889 | 7/1987 | Seidler | 439/876 |
| 4,728,305 | 3/1988 | Seidler | 439/876 |
| 4,737,115 | 4/1988 | Seidler | 439/83 |
| 4,738,627 | 4/1988 | Seidler | 439/876 |

Primary Examiner—Gary F. Paumen
Attorney, Agent, or Firm—Darby & Darby

[57] ABSTRACT

A solder-bearing terminal or lead for attachment to a receptacle in a substrate or to the surface of a substrate, wherein a discrete mass of solder is mechanically held by the terminal or lead in close proximity to the substrate receptacle or surface in position to be melted for connecting the terminal to the substrate with an electrical and mechanical bond, the terminal or lead providing an unobstructed flow for the melted solder to the substrate.

13 Claims, 3 Drawing Sheets

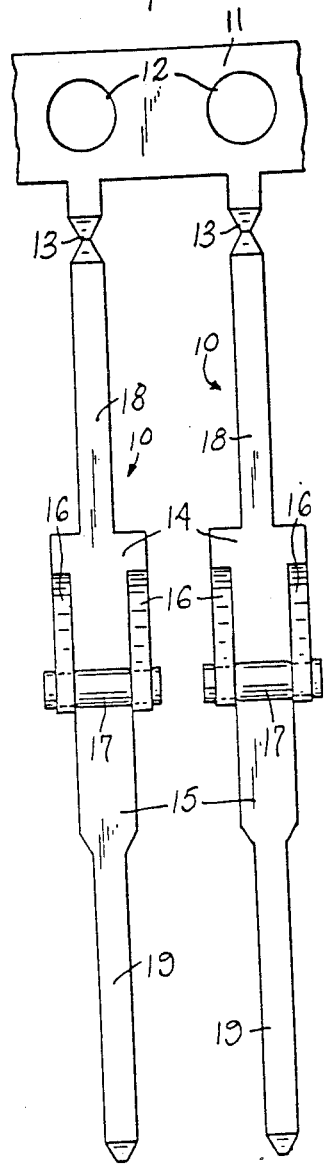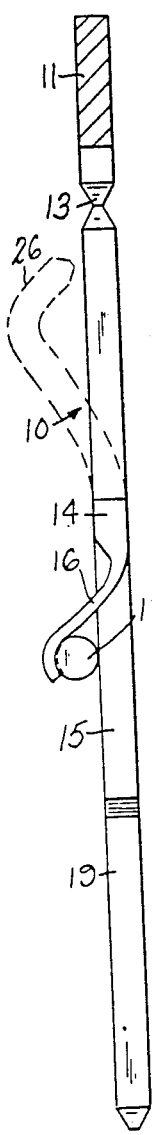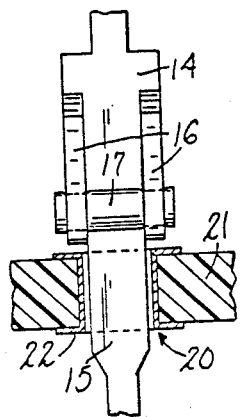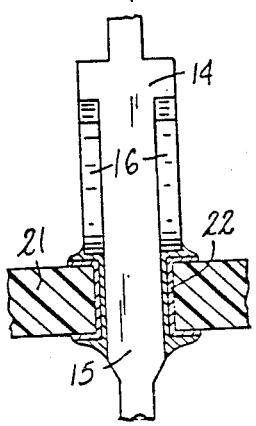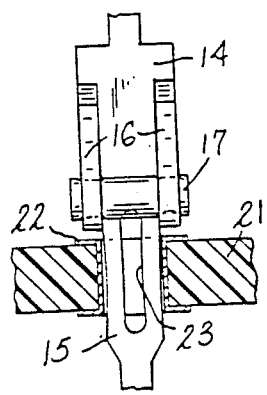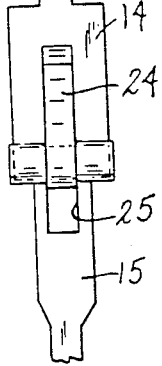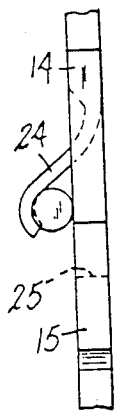

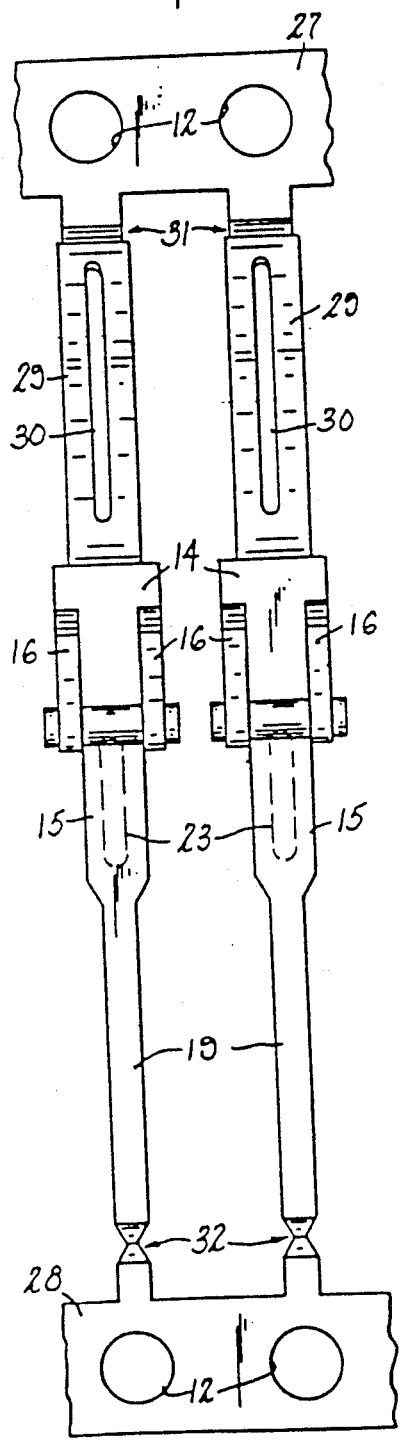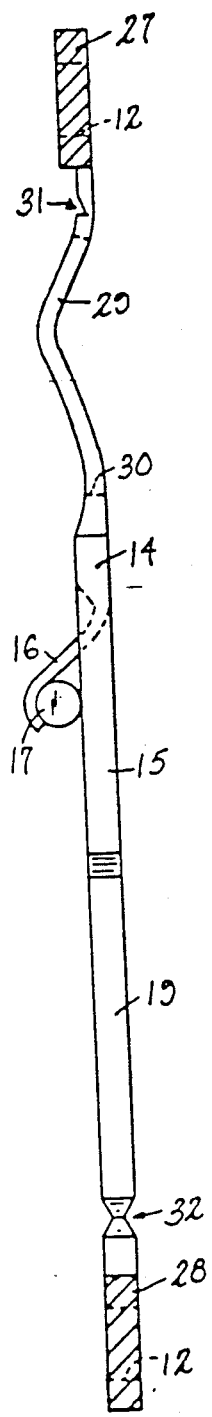

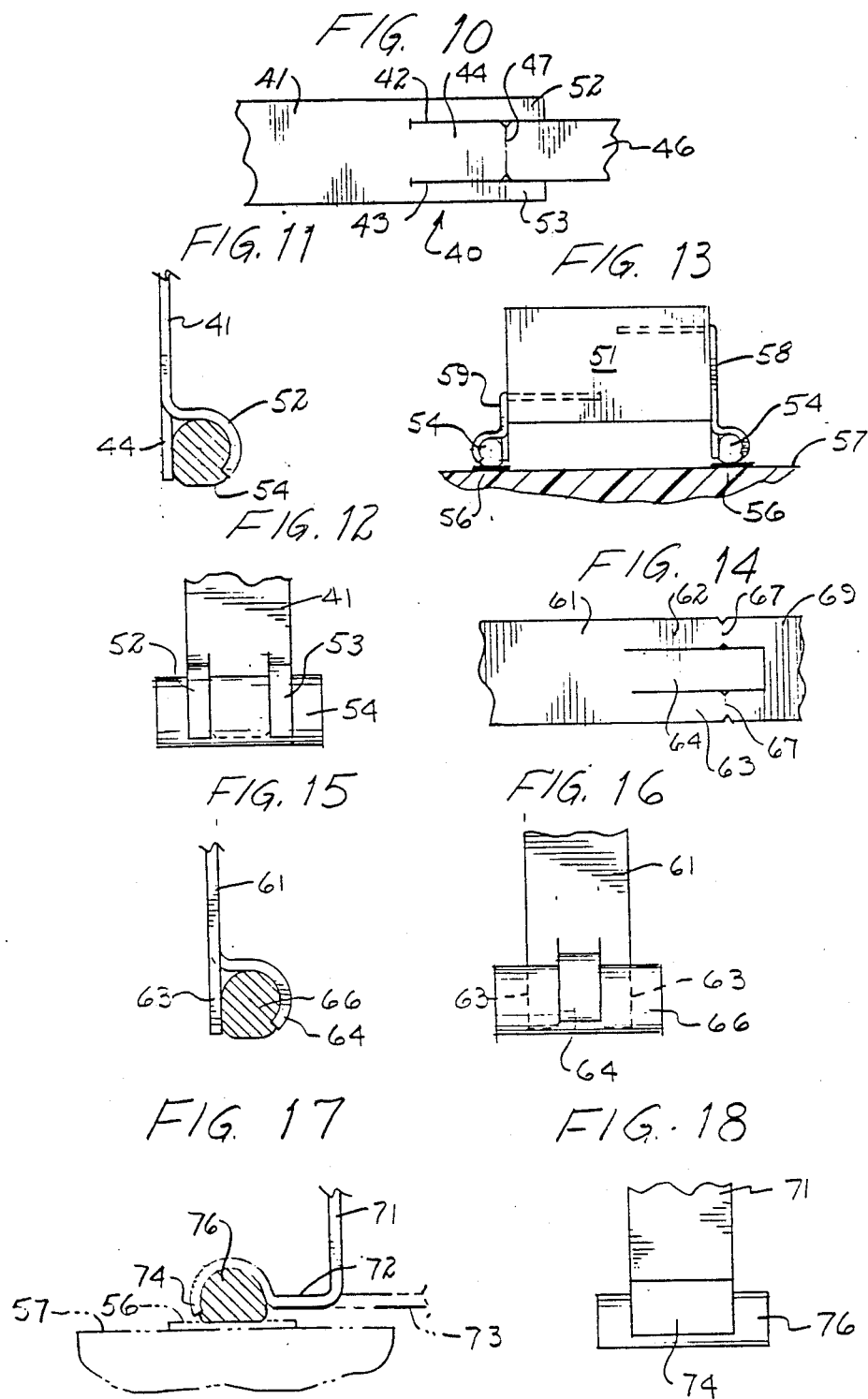

SOLDER-BEARING TERMINAL PIN AND LEAD

The present application is a continuation of application Ser. No. 876,820 filed June 20, 1986, now abandoned, which is a continuation-in-part of application Ser. No. 600,362 filed Apr. 16, 1984, now abandoned, which in turn is a continuation of application Ser. No. 390,764 filed July 9, 1982, now abandoned.

Said prior application Ser. No. 876,820 is also a continuation-in-part of application Ser. No. 850,754, filed Apr. 11, 1986, now U.S. Pat. No. 4,728,305 which is a continuation-in-part of application Ser. No. 793,654 filed Oct. 31, 1985, now U.S. Pat. No. 4,679,889, which in turn is a continuation-in-part of application Ser. No. 737,830 filed May 24, 1985, now U.S. Pat. No. 4,605,278.

BACKGROUND OF THE INVENTION

This invention relates to a solder-bearing terminal pin or lead for attachment to a substrate, either in a receptacle on the substrate or on its surface, wherein a discrete mass of solder is mechanically held by the terminal in position to be melted for connecting the terminal to the substrate with both an electrical and mechanical bond. It is illustrated as a terminal pin or a surface-mounted terminal lead.

The terminal is of a type which is capable of being continuously stamped from a thin sheet of metal at high speed, and because each terminal mechanically holds its own discrete mass of solder, the terminals may be produced individually or preferably, attached to a common carrier strip for automated, machine insertion into the receptacle in the substrate or for application to the surface of the substrate.

Various means have been provided wherein a quantity of solder is associated with a terminal pin so that when the terminal is inserted into a receptacle in a substrate (usually a hole drilled through the substrate with a metal surface plated on its interior and on the surface of the substrate around the periphery of the hole) or is juxtaposed to a conductive surface area of the substrate, and the assembly is heated, the molten solder covers the adjacent surfaces of the terminal and substrate to form, when cool, a soldered metallurgical joint between the terminal and substrate.

In the prior art individual terminal pins were pressed into the receptacle in the substrate and soldering was accomplished by either passing the entire substrate over a solder wave machine or by applying solder to each individual terminal pin using a conventional soldering iron and wire solder.

An alternative method used in the prior art has associated the solder with each terminal pin by means of a metallurgical bond between the solder and the pin wherein the solder was positioned in a location which was away from the receptacle or conductive area in the substrate. This method suffered from poor solder bond because the molten solder was required to migrate, such as down the terminal pin, before it could reach the junction between the terminal and the receptacle which was to be soldered.

SUMMARY OF THE PRESENT INVENTION

The present invention provides a means for securely holding a discrete mass of solder adjacent to a terminal by means of mechanical attachment. At least one finger from the terminal wraps securely around the mass of solder holding it firmly in position, and in the preferred method of manufacture, stamping, the finger is wrapped so securely that it indents slightly into the surface of the softer solder mass thereby making it impossible for the solder to become detached during handling prior to the application of heat and the completion of the soldering operation.

It is an object of the present invention to provide means for attaching securely a discrete solder mass to a terminal in a purely mechanical manner.

It is a further object of the invention to provide a solder bearing terminal wherein each terminal has its own supply of solder in a convenient location for melting to form bonds with a receptacle or conductive area.

It is another object of the invention to provide a solder and terminal assembly which can be made by very simple and efficient stamping steps.

It is yet another object of the invention to provide a solder and terminal lead assembly capable of effective soldering to a conductive area on the surface of a substrate whereby the assembly may serve as a terminal lead for a surface-mounted circuit component.

It is a still further object of the invention to provide certain improvements in the form, construction and arrangement of the parts whereby the above-named and other objects may effectively be attained.

The invention accordingly comprises an article of manufacture possessing the features, properties, and the relation of elements which will be exemplified in the article hereinafter described, and the scope of the invention will be indicated in the claims.

BRIEF DESCRIPTION OF THE DRAWINGS

Practical embodiments of the invention are shown in the accompanying drawings wherein;

FIG. 1 represents the front elevational view of two terminal pins according to the invention attached to a common carrier strip;

FIG. 2 represents a side view of the terminals shown in FIG. 1;

FIG. 3 represents a partial front elevational view of the terminal according to FIG. 1 inserted into a receptacle (shown in section) prior to the application of heat;

FIG. 4 shows the same partial front elevational view as FIG. 3 after sufficient heat has been applied to cause the solder to flow and form a metallurgical joint;

FIG. 5 represents a partial front elevational view of a first modified form of the terminal shown in FIG. 3;

FIG. 6 represents a partial front elevational view of a second modified form of the terminal shown in FIG. 1, the section of the receptacle being omitted;

FIG. 7 represents a partial side view of the modified form of terminal shown in FIG. 6;

FIG. 8 represents the front elevational view of two terminal pins of a third modified form attached to two common carrier strips;

FIG. 9 represents a side view of the terminals shown in FIG. 8;

FIG. 10 is a fragmentary plan view of a portion of a blank adapted to be formed into another modified form of the invention, particularly suitable for soldering to the surface of a printed circuit board or the like substrate, such as for assembling a surface-mounted component to the substrate;

FIG. 11 is a side elevational view partly in cross-section of a terminal formed from the blank of FIG. 10;

FIG. 12 is a front plan view of the terminal of FIG. 11;

FIG. 13 is a side elevation view showing the device of FIGS. 11 and 12 used as solderable terminal leads for a surface-mounted circuit component;

FIG. 14 is a fragmentary plan vie of an alternate form of the blank of FIG. 10;

FIG. 15 is a side elevation view of a terminal formed from the blank of FIG. 14;

FIG. 16 is a front elevation view of the terminal of FIG. 16; and

FIGS. 17 and 18 are side elevation and front elevation views of yet another modification of the terminal of the invention.

DESCRIPTION OF THE PREFERRED EMBODIMENTS

Referring to the drawings, FIG. 1 shows two individual solder bearing terminal pins 10 connected to a common carrier strip 11. The carrier strip may be provided with pilot holes 12 at regular intervals, as is customary, and the terminal pins may be connected to the carrier strip via notched breakaway sections 13 for removal of the carrier strip after the terminal pins have been placed or soldered into position. Each terminal pin includes an upper body portion 14, and a lower body portion 15, two fingers 16, a discrete solder mass 17, and upper contact arm 18, and a lower contact arm 19.

The carrier strip 11 can be any length desired, carrying a great number of terminal pins. The terminal pins and carrier strip are preferably made by continuously stamping them from a thin sheet of metal, and during the stamping operation, the fingers 16 are bent out of the plane of the body of the terminal pin and are wrapped at least partially around the discrete mass of solder 17. During the stamping operation, the fingers are preferably stamped to a thickness which is less than that of the body of the terminal pin. This allows the fingers 16 to be wrapped more readily around the discrete mass of solder 17. During the stamping operation, when the free ends of the fingers 16 are wrapped around the softer metal of the solder, the wrapping can be done with sufficient force to indent the fingers into the surface of the solder to provide a firm mechanical attachment between the solder and the terminal pin which prevents the solder from becoming dislodged during shipping and handling, prior to the completion of the soldering operation.

Referring to FIG. 2, which is a side view of FIG. 1, it can be seen that the fingers 16 are of a thickness which is less than the thickness of the body of the terminal pin. The thickness of the body portions 14 and 15 are, for convenience usually but not necessarily, chosen to be of the same thickness as that of the upper and lower contact arms 18 and 19, respectively. This thickness may be adjusted during the stamping operation.

In use, the contact arms may be soldered to an adjacent printed circuit board, may have wires or other electrical components soldered to them, may serve as pin or blade connectors for an electrical plug, may serve as leads connecting to sockets or other circuit components, may have a wire or wires conventionally wire-wrapped onto them, may function as spring contacts, or may have other electrical and mechanical connections where appropriate. The fingers 16 are preferably stamped from the same thin sheet material as the remainder of the pin, and the thickness of the fingers is reduced during the stamping operation, allowing them to be more easily formed into the appropriate shape.

Upper contact arm 18 may be of any suitable shape. If required, it may have a square cross-section suitable for a wire wrapped connection, or a round cross-section for a solder connection, and it may be straight or bent out of the plane of the terminal pin as indicated in the dashed lines 26 of FIG. 2 to form a spring-like side contact arm. Lower contact arm 19 preferably is of a size such as to permit it to pass through the receptacle in a substrate, which requires that its largest cross-sectional dimension be no larger than the largest cross-section dimension of the lower body portion 15. Lower contact arm 19 may be eliminated entirely where desired, as may upper contact arm 18. In the latter case, carrier strip 11 would be attached directly to the upper body portion 14.

FIG. 1 illustrates the terminal pins connected to a carrier strip 11. While this is a preferred embodiment suitable for automated machine insertion into the substrate, it is also possible, due to the fact that each individual pin is firmly attached to its own solder mass, to use the pins individually as might be desired by the user of small quantities of pins. It is also possible to remove individual or groups of pins from the carrier strip without disturbing the remainder of the pins, which allows a customized array of pins to be inserted as a unit into a corresponding array of receptacles in a substrate.

FIG. 3 shows a detailed front view of the terminal pin in FIG. 1 inserted into a receptacle 20 in a substrate 21 which has been coated with a conductive contact material 22 in the vicinity of the receptacle and on its interior surface. It can be seen that the lower body portion 15 has been sized to closely fit the receptacle in the substrate, which provides a good electrical contact after the portion 15 is joined to the conductive material 22 by soldering. The receptacle in FIG. 3 consists of a hole drilled through the substrate 21 and plated through with a conductive material 22.

FIG. 3 (taken with FIG. 2) also illustrates how the fingers 16 hold the solder in close proximity or juxtaposition to the lower body portion 15 and to the upper surface of the receptacle 20 prior to the application of heat and the completion of the soldering operation.

FIG. 4 is a detailed view of the metallurgical joint formed between the terminal pin and the receptacle in the substrate after the pin and substrate have been heated sufficiently to melt the solder. It can be seen that the solder flows completely around the lower body portion 15, bonding both the upper and the lower surface portions of the contact material on the substrate, the interior of the receptacle, and the fingers 16 to the terminal pin.

FIG. 5 shows a modified form of the terminal pin wherein a longitudinal slot 23 has been cut through the lower body portion 15. The longitudinal slot 23 and lower body portion 15 are correctly sized with respect to the thickness of the substrate 21 and the diameter of the receptacle 20 so that the lower body portion is slightly over-sized with respect to the receptacle 20 prior to insertion, and a tight compressive fit is achieved after insertion. A pin which produces such a tight compressive fit is commonly known as a compliant pin. A compliant pin produces a temporary bond between the terminal pin and the receptacle which allows additional handling of the electrical assembly such as the insertion of other electrical components or their testing prior to soldering, without fear that the previously inserted terminal pins will become dislodged during the additional handling. The use of a longitudinal slot 23 to produce a compliant pin has an additional advantage of allowing the use of individual pins, not attached to a carrier strip, which are extremely susceptible to dislodgement when disconnected from their carrier strip. A further advantage associated with the use of longitudinal slot 23 to provide a compliant pin is that the slot forms a flow channel for the molten solder to reach the underside of the substrate 21. This is especially important where the cross-sectional shapes of the lower body portion 15 and the receptacle 20 are approximately identical, in which case the solder is prevented in the absence of a longitudinal slot 23 from reaching the lower surface. Longitudinal slot 23 also provides additional surface area to allow for a better mechanical and electrical bond between the lower body portion 15 and the receptacle 20.

Referring to FIG. 6 a second modified form of the terminal pin is shown as having a single central finger 24 formed from a U-shaped longitudinal cut 25 along the axis of the body. The U-shaped longitudinal cut 25 can be extended down the axis of the lower body portion 15 to perform the same function as longitudinal slot 23 to provide a compliant pin.

FIG. 7 is a side view of the second modified form shown in FIG. 6. It can be seen in both FIGS. 2 and 7 that the engaging fingers 16 and 24 wrap partially around the mass of solder 17 holding it in the gap formed between the finger or fingers and the body of the terminal pin. The fingers can wrap partially or completely around the solder mass as desired, and the solder mass may be of any suitable shape. It is of particular value that the solder mass 17 have substantially fully open access to the substrate 20, through the opening between finger 24 or fingers 16 and body portion 15, with the solder mass 17 in close proximity to or touching the conductive area of the substrate to which a soldered joint is desired. This improves the reliability of the soldering operation and of the resulting soldered joint. It is also valuable to have the finger indent into the surface of the softer solder mass, particularly, when only a single finger is used for attachment, to prevent the solder from becoming disengaged from the terminal pin prior to the application of heat.

FIG. 8 is a front elevational view of two terminal pins of a third modified form connected to two common carrier strips, an upper carrier strip 27 and a lower carrier strip 28, both of which are provided with the customary pilot holes 12. In this modified form the upper contact arm 29 is a cantilever spring blade contact with a central longitudinal slot 30 which provides additional spring action for the upper contact arm 29. The two common carrier strips 27 and 28, provide additional rigidity for the attached terminal pins, which keeps them in accurate alignment during shipping and handling prior to their insertion into the receptacle.

FIG. 9 is a side view of the third modified form shown in FIG. 8. It can be seen in this view that the upper contact arm 29 has been stamped to a thickness which is less than that of the body of the terminal pin, which provides additional spring action. An upper break-away notch 31 and lower breakaway notch 32 can also be clearly seen in this figure.

Although FIG. 8 has been drawn with two fingers 16, it is apparent that it can be constructed with a single central finger 24 as shown in FIGS. 6 and 7. It also can be constructed with or without a central longitudinal slot 30 or a longitudinal slot 23 as desired. Furthermore, a lower carrier strip 28 may be used in conjunction with any of the terminal pins shown and where such a lower carrier strip is used, the upper carrier strip is optional. Each terminal can also be made by simple stamping and assembling steps, with minimal waste of material.

FIGS. 10–13 show a modified form of terminal intended particularly for use in surface mounting of a circuit component on a substrate, such as a printed circuit board. FIG. 10 shows a blank 40 for such a terminal which has a flat elongated body portion 41, of any desired length, and may be connected directly or through an arm (like 18 of FIG. 1) to a carrier strip like 11 of FIG. 1. Body portion 41 is slit at 42 and at 43, to form a body portion extension 44 of reduced width, which is integral with a carrier strip similar to carrier strip 11 shown in FIG. 1 or may be joined to it by a connecting arm 46. Body portion extension 44 is preferably joined to arm 46 by a breakaway portion 47. It will be understood that body portion 41 may at its left end have any suitable conformation for being joined to electrical circuit components or wires or connectors or other conductors.

The slits 42 and 43 form a pair of side fingers 52 and 53 which are bent away from the body portion 41 and then bent reflexively back, to form a partially enclosed space between body extension 44 and fingers 52, 53, the space having an open end generally facing in the same direction as the length of the body portion 41 and its extension 44. The slits 52, 53 are wrapped around a solder mass or slug 54 similar to solder mass 17 of the previous figures. As seen in FIGS. 11 and 12 the end of body extension 44, after forming and after arm 46 has been broken away is essentially coterminous with the ends of fingers 52, 53 and coplanar with them in a plane generally perpendicular to body portion 41. It will be seen that the arrangement of fingers 44, 52 and 53 leaves an unobstructed opening on the under side as seen in FIGS. 11 and 12, through which solder may flow freely when melted. Accordingly, as seen in FIG. 13, this arrangement is particularly adapted to serve as a terminal joining an electrical component 51 to conductive areas 56 (sometimes called contact pads) on a substrate 57.

In use, the assembly of FIG. 13 formed of electrical component 51 and terminals 58 and 59, having the structure shown in FIGS. 11 and 12, may simply be placed on the substrate 57 with each solder mass 54 close to or in contact with a respective contact pad 56 of substrate 57. Then upon applying heat, the solder will melt and flow freely around the ends of fingers 52, 53 and body extension 44, in contact with pad 56, so that upon recooling the solder will effectively join the body extension 44 and fingers 52, 53 to the contact pad 56 in each instance.

While the solder mass 54 is illustrated as extending outwardly slightly beyond the edges of the body extension 44, and fingers 52, 53 it may be flush with those fingers or even slightly recessed.

This arrangement has the advantage that there is no obstacle to the free flow of solder from the terminal to the contact pad 56 so that a more reliable mechanical and electrical connection is made, without need to rely upon capillarity or similar phenomena for assuring access of the solder to all areas to be soldered.

It will be understood that instead of the central body extension 44 being coplanar with the terminal body 41 as in FIGS. 11 and 12, with the fingers 52 and 53 curved around the solder mass, these may be interchanged as shown in FIGS. 14–16, where the side fingers 62 and 63 are coplanar with the body 61, while the central finger 64 curves around the solder mass 66 to retain it in the terminal assembly. In this case the side fingers 62, 63 form extensions of the main body portion 61, and may be joined to a connecting arm 69 leading to a carrier strip for the series of terminals, break notches are formed at 67 to permit separating the arm 69 and carrier strip.

While in the foregoing figures, the solder-access opening is shown generally in a plane perpendicular to the terminal body portion, and facing along the length of the body portion, in a modified form the body portion may extend generally in the direction of the plane of the opening. This is illustrated in FIGS. 17–18. In this form the body portion 72 extends generally parallel to the mating substrate 57, and may have a portion 71 bent upward at right angles to portion 72, or an extension 73 (shown in dotted lines) in the direction of portion 72. In this instance, the entire end of the body portion 72 may be bent around the solder mass 76, as shown at 94. The end of the curved portion 74 may dig into the solder mass, or may be wrapped more than 180 degrees about the solder mass 76, to retain the solder mass in place. Again, the solder is provided with an unobstructed flow opening juxtaposed to the contact pad 56 on the substrate 57.

The arrangements shown in FIGS. 10–18 provide a particularly useful arrangement for surface-mounting circuit elements on a substrate, in lieu of mounting them in receptacles or holes in the substrate as in the case of FIGS. 1–9.

In each of the terminals described above, the mass of solder is in mechanical engagement with the terminal fingers or body in position to be melted for the ready formation of a bond between the terminal fingers, the terminal body and the receptacle in or contact area on the substrate. The solder mass may, if desired, have a cross section of circular, square or other geometrical form, or be made from spherical pellets. In each instance, the terminals may be joined to one or both carrier strips, for simultaneous multiple applications, or may be formed individually. They may particularly be fabricated by automated progressive-stage stamping, from a roll of conductive and suitably resilient strip material, to form a roll of formed terminals for easy applications.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

What is claimed is:

1. A solder-bearing lead adapted to be soldered to a conductive area on a substrate having a lead-receiving opening, said lead comprising an elongated body having an upper body portion and a lower body portion, said lower body portion being sized to fit in said substrate opening substantially perpendicular to said substrate, said body being cut longitudinally to define a finger having a first end integral with and attached to said body and also having a free end, , said finger being bent out of the plane of said body and having a portion spaced from and in opposition to said body, a solder mass, said finger being bent only partially around said solder mass with each solder mass held between said finger free end and said body, said finger free end being wrapped only partially around said solder mass to leave at least a portion of said solder mass uncovered by said finger, said uncovered solder mass portion being in a position to confront directly and to contact said substrate conductive area with the end of said finger adjacent to said conductive area but not interposed between said solder mass and said conductive area, said body also being cut longitudinally along a second line to define a second finger, said fingers being separated by said upper body portion, both of said fingers being wrapped only partially around said solder mass.

2. A lead according to claim 1, further comprising at least one contact portion attached to said body.

3. A lead according to claim 1 wherein said finger is indented into the surface of the mass of solder for holding the mass securely in position.

4. A lead according to claim 1 wherein the lead has an upper contact portion attached to and substantially axially aligned with the upper body portion, and a lower contact portion attached to and substantially axially aligned with the lower body portion, said lower contact portion being at least as small in its thickness and width as the lower body portion to allow the lower contact portion to pass through the opening in the substrate.

5. A lead according to claim 4 wherein the upper contact portion comprises a spring-like blade contact with a central longitudinal slot.

6. A method of soldering a lead to a conductive area of a substrate, comprising the steps of providing a conductive lead having an elongated body, said body having a finger with a first end integral with and attached to said body and also having a free end spaced from said body, said finger being bent around and wrapped only partially around a solder mass with a portion of said solder mass uncovered between the free end of said finger and said body, placing said lead on said substrate with said solder mass between said substrate conductive area and said finger and with said substrate conductive area juxtaposed to and directly confronting said uncovered solder mass portion without said finger interposed between said solder mass and said conductive area, and applying heat to melt said solder mass, whereby on cooling said lead is soldered to said conductive area.

7. A method as in claim 6 wherein said finger is formed by a longitudinal cut in said body.

8. A method as in claim 7 wherein said body has a second integral finger wrapped only partially around said solder mass without being interposed between said solder mass and said conductive area.

9. A method as in claim 6 wherein said finger is formed by a substantially U-shaped cut in said body, centrally of and between spaced lateral portions of said body.

10. In combination, a substrate having a conductive area, a lead for soldering to said conductive area, and
a solder mass,
said lead having a portion partially encircling said solder mass, with a gap between an end of said portion and said lead, said solder mass remaining uncovered in said gap between said end and said lead,
said uncovered solder mass portion facing and being directly juxtaposed to said substrate conductive area,
whereby, upon melting said solder, it is caused to flow unobstructedly into contact with said conductive area to solder said lead to said conductive area.

11. A combination as in claim 10 wherein
said lead portion is a finger partially encircling said solder mass on a side thereof remote from said conductive area without obstructing flow of melted solder to said conductive area.

12. A combination as in claim 10 wherein
said lead has an end portion,
said lead end portion having a body portion and at least one finger extending from said body portion, said body portion and finger together partially encircling said solder mass on a side thereof remote from said conductive area, without obstructing flow of melted solder to said conductive area.

13. A combination as in claim 10 wherein
said lead portion is formed to partially encircle said solder mass on the side thereof remote from said conductive area without obstructing flow of melted solder to said conductive area;
said lead portion having a body portion whose end partially encircles said solder mass.

* * * * *